United States Patent [19]

Brakus et al.

[11] Patent Number: 5,742,494
[45] Date of Patent: Apr. 21, 1998

[54] CIRCUIT ARRANGEMENT FOR DRIVING A CONVERTER

[75] Inventors: Bogdan Brakus, Stockdorf; Heinz-Jürgen Roth, München, both of Germany

[73] Assignees: Siemens Aktiengesellschaft, Munich; SGS-Thomson Microelectronics, Grasbrunn, both of Germany

[21] Appl. No.: 836,249

[22] Filed: Apr. 25, 1997

[30] Foreign Application Priority Data

Oct. 28, 1994 [DE] Germany ............. 44 38 671.0

[51] Int. Cl.⁶ ...................................... H02M 1/12
[52] U.S. Cl. .................................. 363/41; 363/97
[58] Field of Search ............................ 363/39, 40, 41, 363/95, 97, 131

[56] References Cited

U.S. PATENT DOCUMENTS

| | | | |
|---|---|---|---|
| 3,831,113 | 8/1974 | Ahmed | 331/111 |
| 4,016,498 | 4/1977 | Hadley | 328/181 |
| 5,469,349 | 11/1995 | Marinus | 363/97 X |
| 5,528,486 | 6/1996 | Kumar et al. | 363/95 |
| 5,581,452 | 12/1996 | Yamanoto | 363/41 |

FOREIGN PATENT DOCUMENTS

| | | |
|---|---|---|
| 4105464 | 10/1991 | Germany . |
| 2072448 | 9/1981 | United Kingdom . |

*Primary Examiner*—Peter S. Wong
*Assistant Examiner*—Y. J. Han
*Attorney, Agent, or Firm*—Hill, Steadman & Simpson

[57] ABSTRACT

Input-voltage-controlled pulse generator (VCO-PWM) for driving a pulse converter or switch-mode power supply with a variable duty ratio and a fixed maximum test level and variable clock frequency.

12 Claims, 11 Drawing Sheets

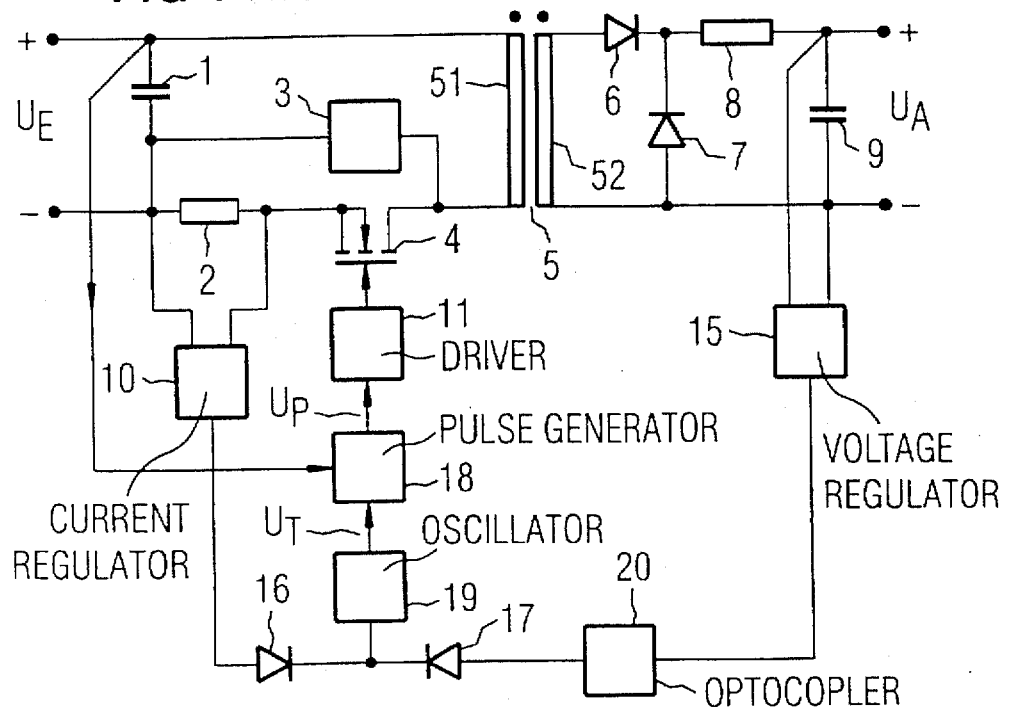
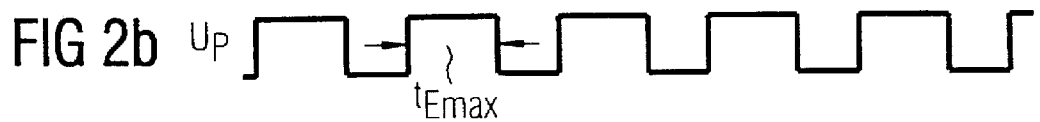
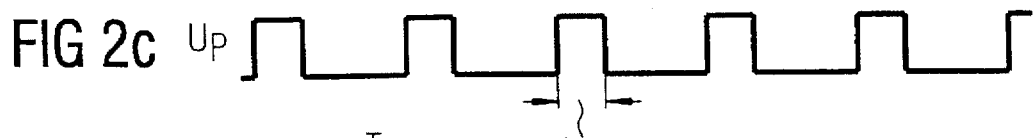
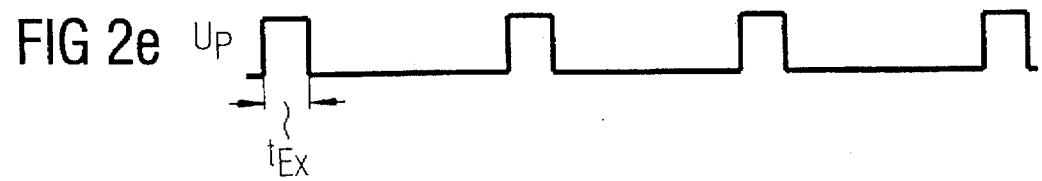

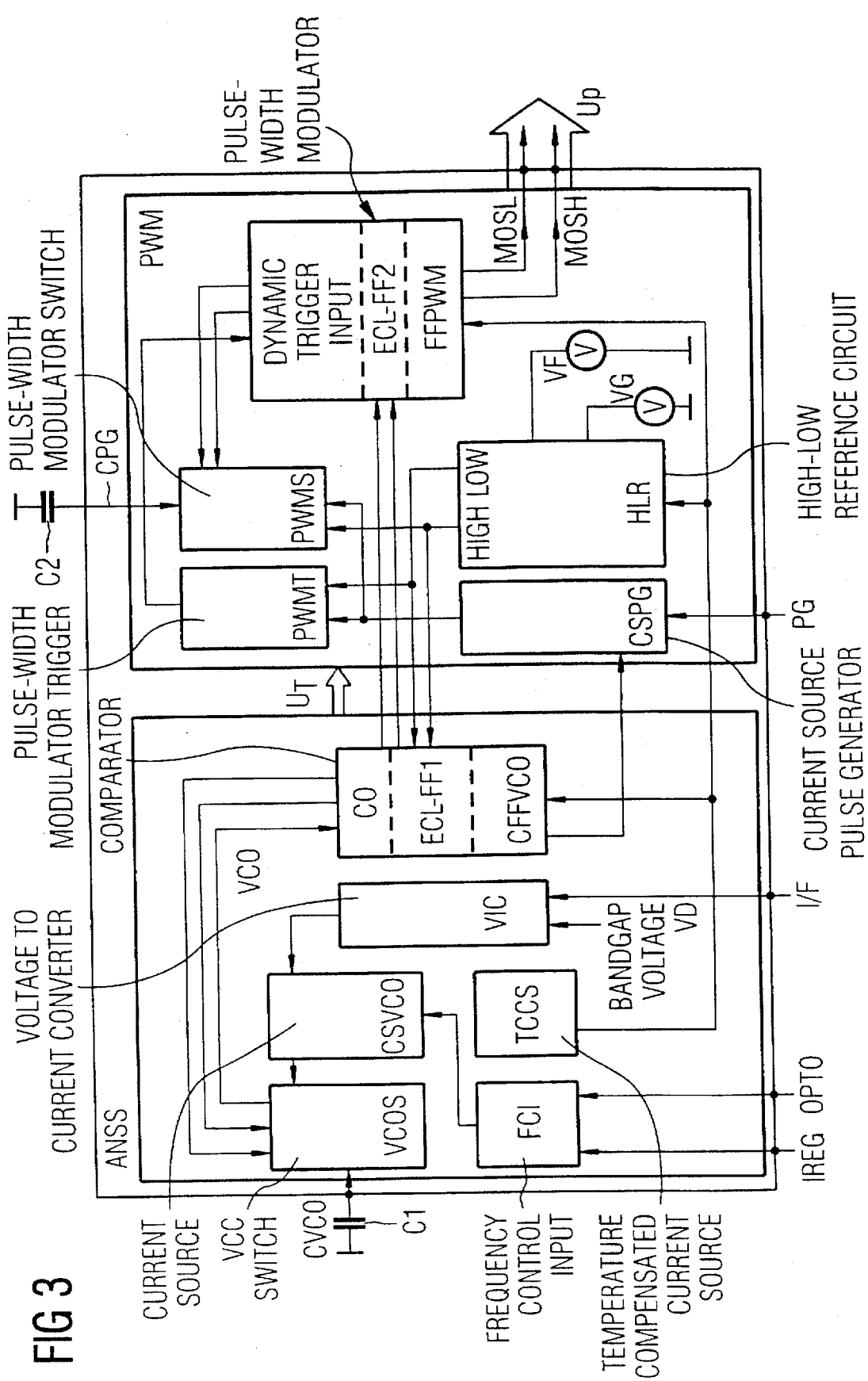

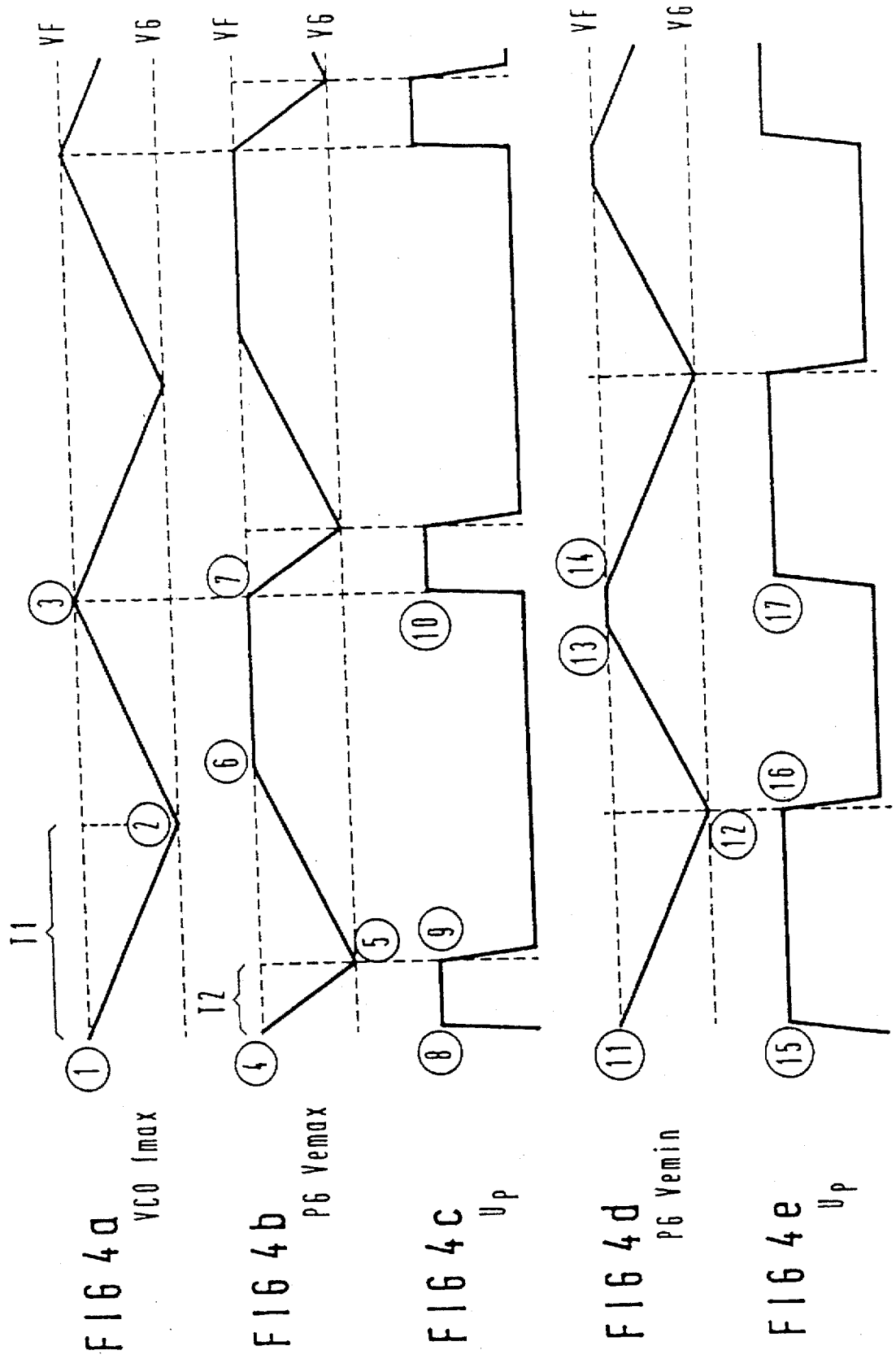

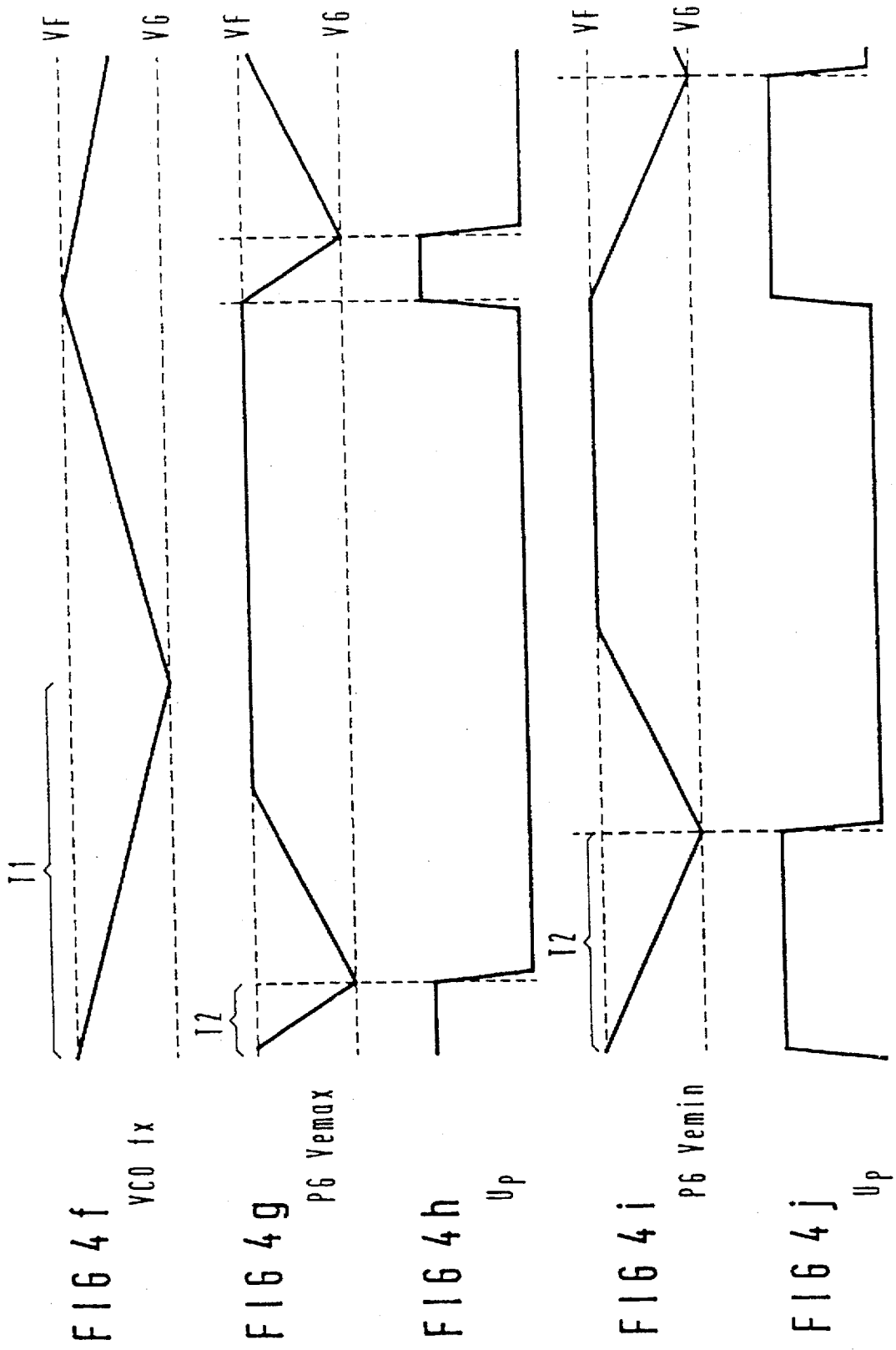

CIRCUIT ARRANGEMENT FOR DRIVING A CONVERTER

BACKGROUND OF THE INVENTION

The invention relates to a circuit arrangement for controlling a repetition frequency and the period for which a pulse switch-mode converter is switched on. A circuit arrangement for controlling the repetition frequency and the period for which a device is switched on has already been proposed in Laid-Open Specification DE 41 05 464 A1. Such circuit arrangements come up against their applicability limits at relatively high frequencies.

SUMMARY OF THE INVENTION

The object of the invention is to design a control chip such that it is suitable for high control frequencies, with a comparatively low intrinsic current consumption.

In general terms the present invention is a circuit arrangement for driving a switch-mode converter or switch-mode power supply having an oscillator which is connected to a pulse-width modulator. An electronic switch is arranged in the main circuit of the converter. The electronic switch is controlled by a switch-on signal whose frequency can be varied via at least one control input of the oscillator, and whose duty ratio can be varied via at least one control input of the pulse-width modulator. The pulse-width modulator has a capacitive storage unit which is connected to a discharge unit, to a charging unit and to a first input of a comparator whose second input is connected to a first reference voltage. The charging unit is connected to a further comparison unit. A control unit is provided whose first input is connected to the output of the comparator, and whose second input is connected to the output of the oscillator. At least one output of the control unit is connected to the discharge unit. Controlled by the oscillator, discharging of the storage element, originating from a defined potential, is initiated by the control unit while the switch-on signal is emitted from the control unit. On reaching the first reference voltage which is applied to the comparator, the discharging and, with it, the switch-on signal are ended by an output signal of the comparator which is passed to the control unit. Subsequently, the storage element is once again charged to the defined potential.

Advantageous developments of the present invention are as follows.

A first constant current source, one of whose connections is connected to the operating potential, is provided as the charging unit. The comparison unit has a second constant current source and an emitter, which is connected to its output, of a first transistor whose collector is connected to the operating potential and whose base is at a second reference voltage. The comparison unit also has a first diode which is connected to the output of the second constant current source and is connected in series with the first constant current source.

The discharge unit is formed from a difference stage having two emitter-coupled transistors and a third constant current source, in parallel with which a transistor of a symmetrical circuit is connected. Both the anode of a second diode as well as a resistor are arranged at the base of the transistor of the symmetrical circuit. A control variable, which controls the transistor of the symmetrical circuit, is applied to the resistor. The control variable is the input voltage.

The discharging of the storage element and of a further storage unit which influences the repetition frequency of the oscillator is initiated by two multivibrator stages which are triggered in series. The first multivibrator stage is arranged in the control unit of the pulse-width modulator. The second multivibrator stage is arranged in the oscillator.

The duty ratio of the switch-on signal can be set independently of the maximum repetition frequency of the oscillator.

The storage units are capacitors.

The input impedance of the downstream circuits is adapted when the repetition frequency of the voltage-controlled oscillator is reduced.

The oscillator is a voltage-controlled oscillator.

The transistors operate in the unsaturated mode.

Temperature-compensating currents are used.

The circuit arrangement can be integrated on a chip using ECL and current source circuit technology.

In addition to the advantage that the circuit arrangement requires a small amount of space, the invention has the further advantages that a low current requirement and continuous current limiting can be implemented over a wide control range, in particular for high frequencies. The circuit arrangement furthermore provides the advantage that exact inverse proportionality is provided between the input voltage and the pulse widths of the output signal. The circuit arrangement has the advantage that the frequency and the duty ratio of the output signal can be varied over wide ranges independently of one another.

A further advantage of the circuit arrangement is that, as the repetition frequency is reduced, the current consumption of the specified circuit arrangement reduces, resulting in favorable efficiency with a low power requirement on the secondary side.

A further refinement of the circuit arrangement is that this circuit arrangement can be implemented in an integrated circuit and requires a very small number of external components.

A further refinement of the circuit arrangement is that this circuit arrangement is temperature-compensated and operates in the unsaturated mode, which results in operation at high frequencies with low power losses and good temperature stability.

A further refinement of the circuit arrangement comprises effective protection of the circuit arrangement being provided during a conducting phase via an input sensor which shortens the switched-on time in inverse proportion to the input voltage.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 shows a known converter,

FIGS. 2a–2e show associated pulse diagrams,

FIG. 3 shows a schematic illustration of a circuit arrangement for driving a converter, FIGS. 4a–4j show associated pulse diagrams

DESCRIPTION OF THE PREFERRED EMBODIMENTS

Figure 5:
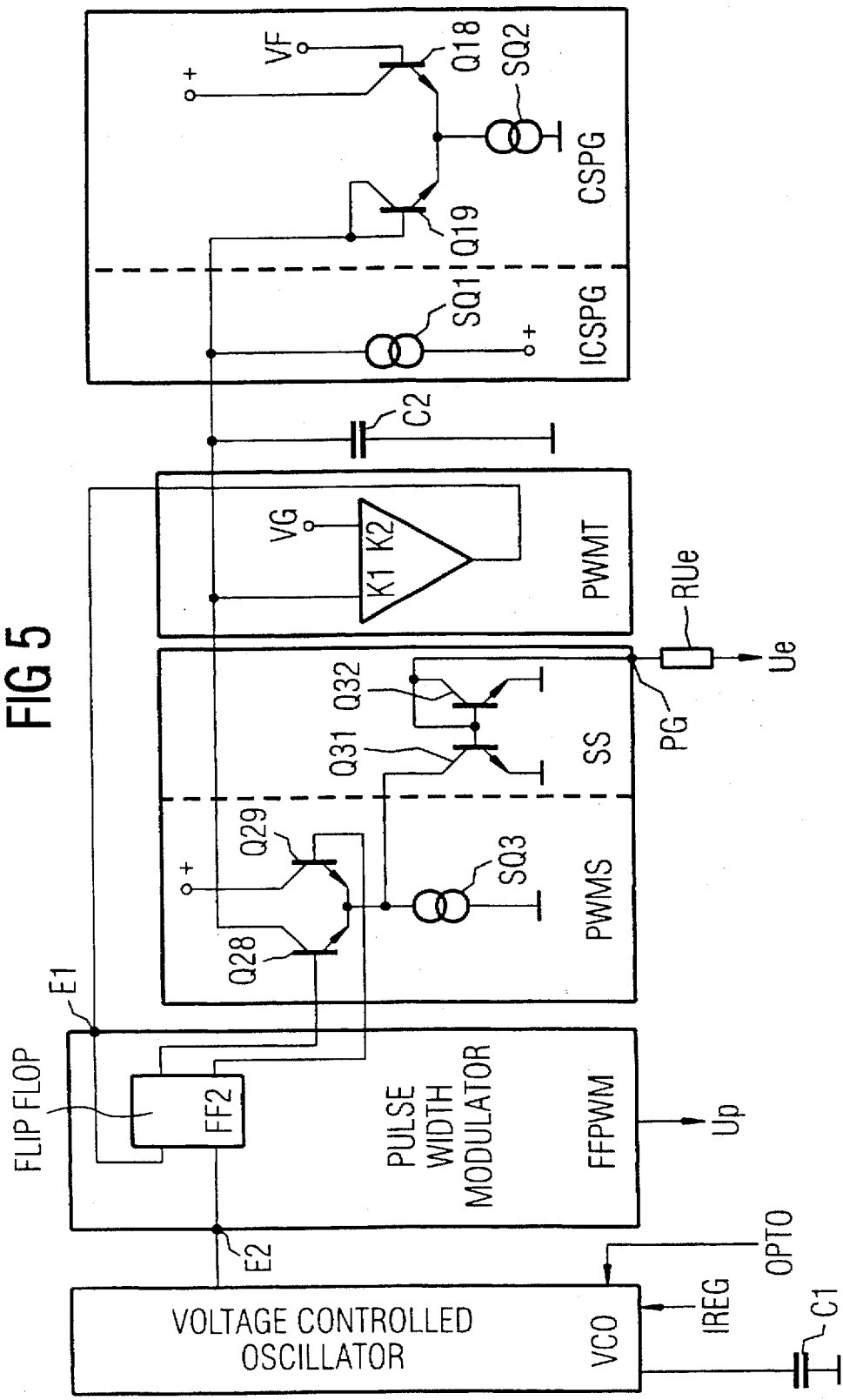
FIG. 5 shows a further schematic illustration.
Figure 6:
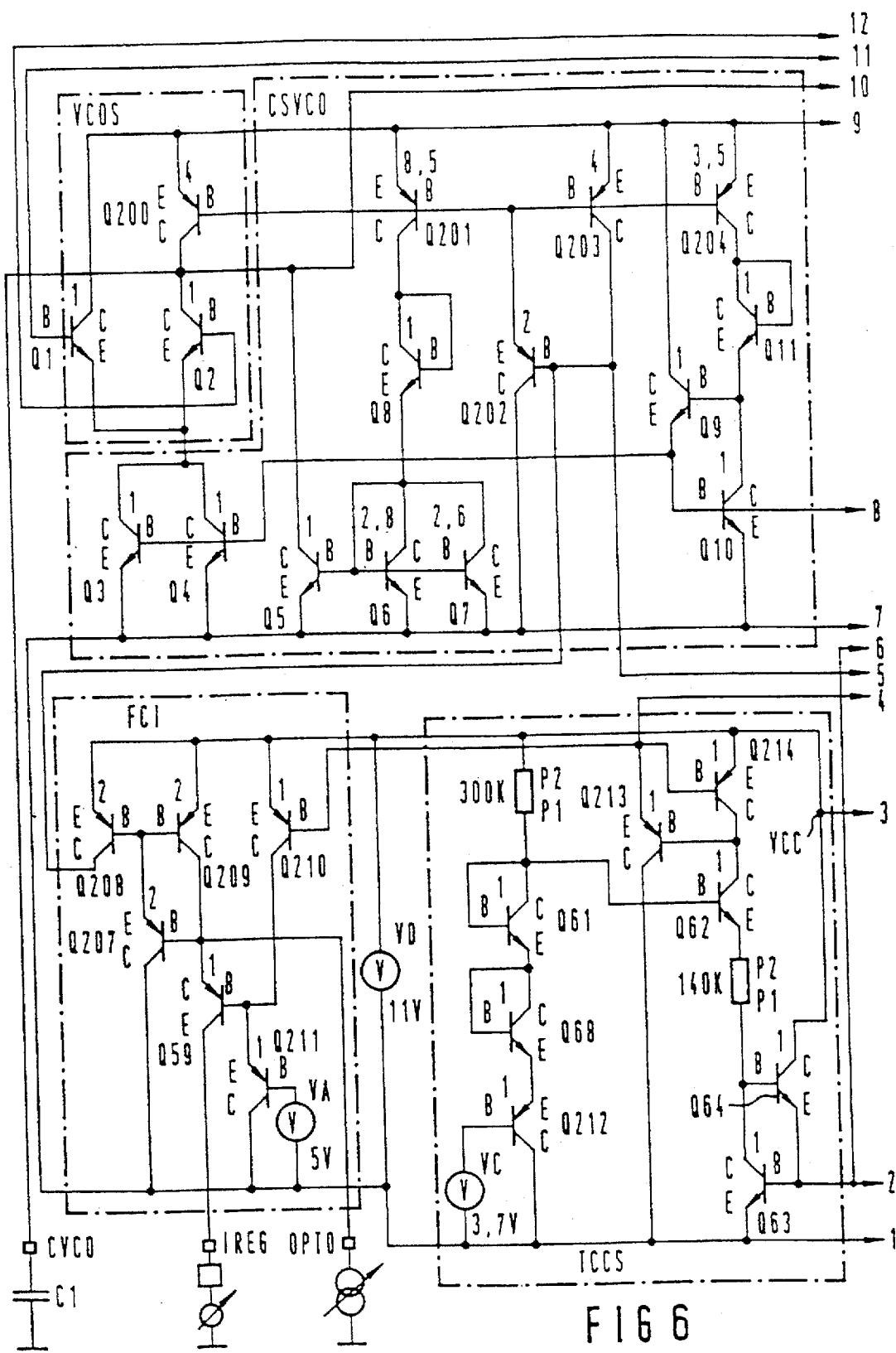
FIGS. 6, 7, 8, 9 show a detailed illustration of the schematic illustration of the circuit arrangement which is illustrated in FIG. 3.
Figure 7:
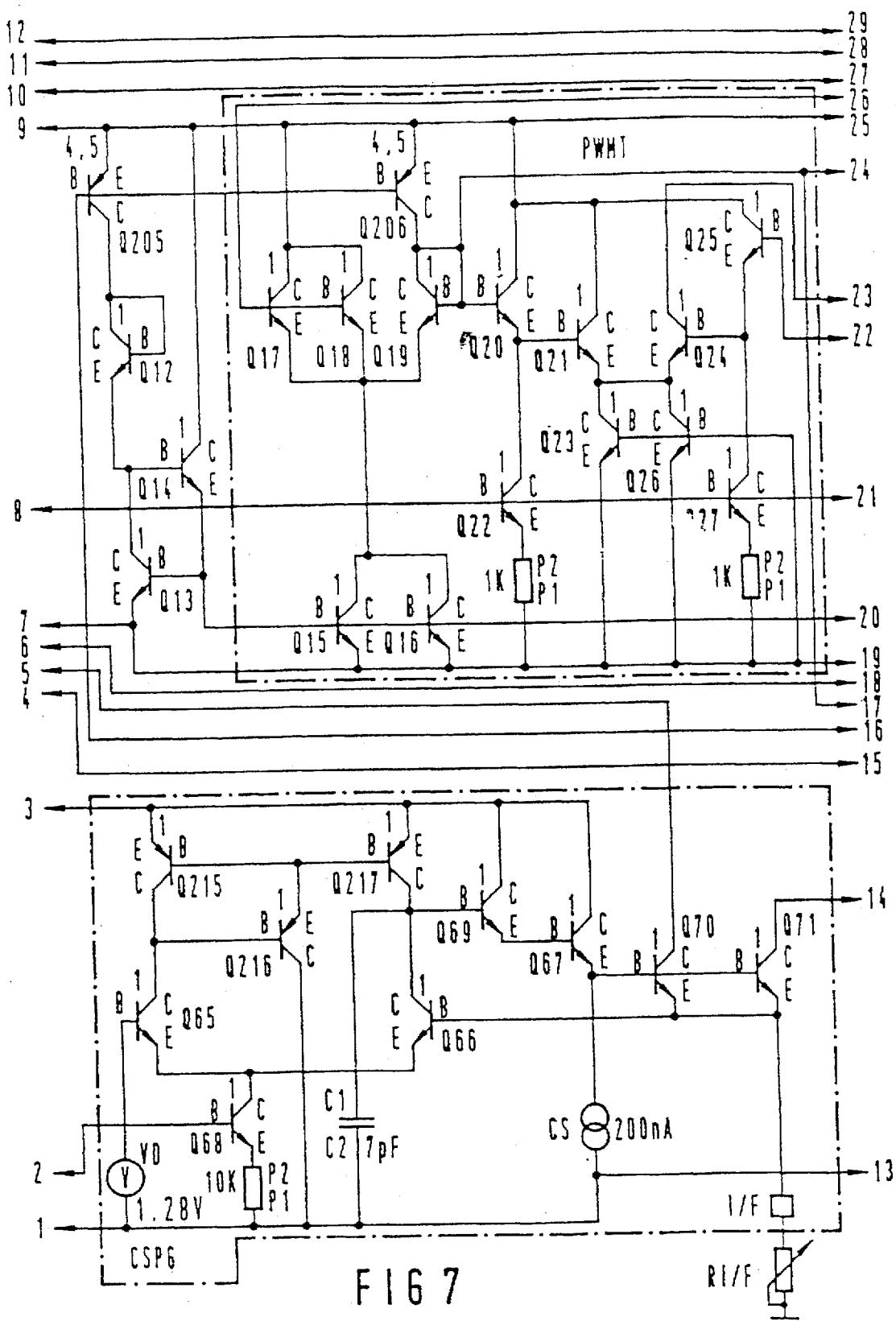
Figure 8:
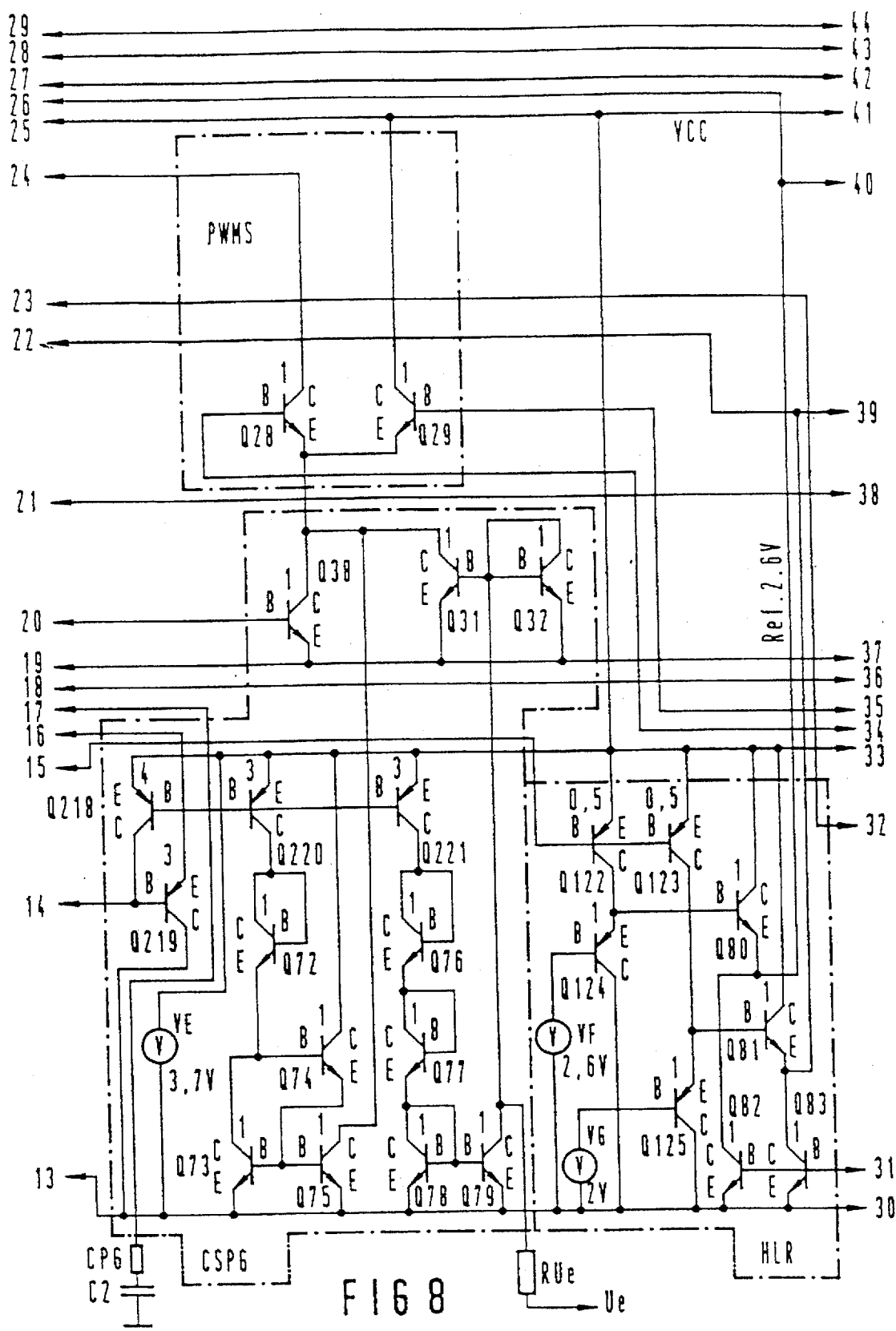
Figure 9:
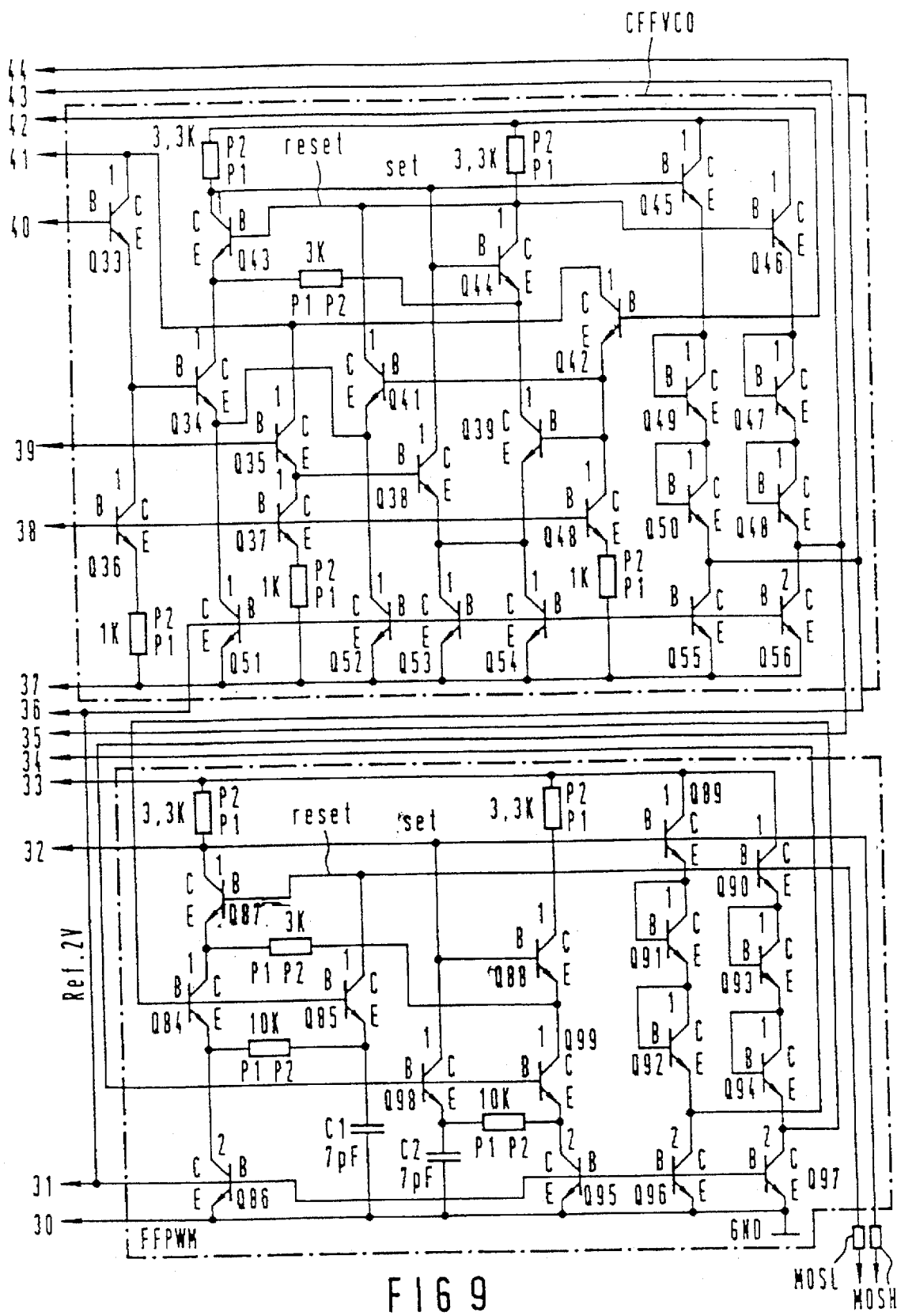

To provide better understanding of the invention, the method of operation of a forward converter will be explained with reference to FIG. 1 and FIG. 2. In the case of the forward converter which is shown in FIG. 1, the input voltage UE is applied to the capacitor 1, and the output voltage UA is applied to the capacitor 9. A series circuit, which is formed from the primary winding 51 of the transformer 5, the drain-source path of the field-effect transistor 4 and the measurement resistor 2, is connected in parallel with the capacitor 1. The arrangement 3 for the RCD circuitry is connected in parallel with the series circuit formed from the measurement resistor 2 and the drain-source path of the field-effect transistor 4. The rectifier diode 6 is connected between the secondary winding 52 of the transformer 5 and the capacitor 9. The freewheeling diode 7 is arranged in a parallel path downstream from the rectifier diode 6. The inductor 8 is connected in a series path between the freewheeling diode 7 and the capacitor 9. The control electrode of the field-effect transistor 4 is connected to a driver 11. The measurement resistor 2 is connected to a current regulator 10, and a voltage regulator 15 as well as an optocoupler 20 are connected to the output of the converter. The current regulator 10 and the optocoupler 20 are connected via in each case one diode 16 or 17, respectively, to the input of an oscillator 19. One input of the pulse generator 18 is connected to the input of the converter, that is to say to the input voltage UE. A further input is connected to the voltage-controlled oscillator 19. The pulse generator 18 receives a clock voltage UT at a variable frequency, via this input. The pulse generator 18 produces a series of pulses Up whose repetition frequency is predetermined by the voltage-controlled oscillator 19 and the period for which the pulses are switched on is inversely proportional to the input voltage UE. In general, the pulse generator 18 supplies pulses Up which are switched on for a specific period tE. The repetition frequency is set by the voltage-controlled oscillator 19 in accordance with the operating point of the current regulator 10 or of the voltage regulator 15, via the optocoupler 20. In the limiting case, the maximum frequency, which corresponds to the minimum period duration Tmin, can be determined by the minimum switched-on duration which can be implemented and the desired duty ratio:

$$f = \gamma/t_E \quad (3)$$

In this case, f is the repetition frequency of the switch-on pulse, $\gamma$ is the duty ratio and $t_E$ is the duration of the switch-on pulses. A frequency of 1 MHz results for a switch-on pulse having a duration of $t_E = 0.5$ μs and the duty ratio $\gamma = 0.5$. The duration of the switch-on pulse depends on the input voltage $U_E$. It is inversely proportional to the input voltage $$t_E \sim 1/U_E \quad (4)$$

In the case of the forward converter, the change in the input voltage $U_E$ is the dominant disturbance variable. The following relationship applies to the idealized, loss-free converter:

$$U_A = 1/U_E \cdot \gamma \quad (5)$$

If the product $U_E \cdot t_E$ remains constant after introducing the relationship (4), then the frequency does not need to be changed in the event of an input voltage change, in order to keep the output voltage $U_A$ constant.

The pulse diagrams which are illustrated in FIGS. 2a–2e show the basic behavior of the converter for various operating states.

a) In the starting phase and/or when the output voltage is too low, the voltage-controlled oscillator VCO (19) sets the maximum frequency. This corresponds to the minimum period duration $T_{min}$ of the clock pulses $U_T$.

b) At the minimum input voltage, the pulse generator 18 supplies the switch-on pulse $U_p$ with the maximum duration $t_{Emax}$.

c) An increase in the input voltage results in the switch-on time being shortened to a new value $t_{Ex}$, without the frequency being changed at the same time.

d/e) The two diagrams show the frequency reduction in the event of a major reduction in load or in the event of overload, with the input voltage $U_E$ being unchanged. The longer period duration $T_y$ is set, with a constant switch-on time $t_{Ex}$.

FIG. 3 shows a schematic illustration of a refinement of the circuit arrangement according to the invention. This circuit arrangement ANSS for driving a converter is essentially composed of the circuits which are arranged in a function block VCO, a voltage-controlled oscillator, and of the circuits which are arranged in a function block PWM, a pulse-width modulator.

In detail, the function block VCO contains the following circuits:

FCI: Frequency Control Input,
VCOS: VCO-Switch,
CSVCO: Current Source VCO,
TCCS: Temperature Compensated Current Source,
VIC: Voltage to Current Converter and
CFFVCO: Comparator CO, ECL Flip-Flop ECL-FF1.

The function block PWM contains the following circuits:

CSPG: Current Source Pulse Generator,
PWMT: Pulse-Width Modulator Trigger,
PWMS: Pulse-Width Modulator Switch,
HLR: High-Low Reference and a circuit for
FFPWM: ECL Flip-Flop ECL-FF2, Pulse -Width Modulation PWM.

Individual circuits are provided with control connections. The frequency and the duty ratio of the output signal (switch-on signal) Up can be influenced via these control connections. The output signal Up has the voltage levels MOSL, MOSH. On the one hand, the frequency of the output signal Up can be influenced via the control connection CVCO, IREG, OPTO, I/F and, on the other hand, the duty ratio of the output signal Up can be influenced via the control connections CPG and PG. The overall current consumption of the circuit arrangement ANSS can be varied via the input I/F.

The output signal Up of the circuit arrangement ANSS can be influenced as summarized in the following text via the connections which are indicated on the individual circuits VCOS, FCI, VIC as well as PWMS and CSPG:

CVCO: Capacitor connection for determining the maximum clock frequency,

IREG: Setting input for reducing the frequency, with an internal threshold set by the reference voltage which is designated VA.

OPTO: Current setting input for reducing the frequency.

I/F: Setting the maximum frequency in conjunction with CVCO.

PG: Initial control/reduction of the "on time" of the output signal Up,

CPG: Capacitor connection for determining the maximum duty ratio.

The schematic circuit arrangement ANSS shown in FIG. 3 can be controlled at high frequencies with a low power consumption, the frequency and the duty ratio (duty cycle) being variable over wide ranges. In order to keep the power consumption low, for example in the case of fast transistors having a transit frequency of 6 GHz, the transistors in the circuit arrangement operate in the unsaturated mode. In order to vary the frequency and the duty ratio of the output signal Up, formed by the differential voltage levels MOSL and MOSH, over a wide range, and make them independent of temperature, temperature-compensated currents are used, which are variable over a plurality of decades. In order to implement the storage and control functions, monitoring circuit parts CFFVCO, FFPWM are used which have comparator and flip-flop characteristics and supply constant differential ECL output levels. The input impedance of the monitoring circuit part is continuously adapted in order to achieve adaptation of the input currents of said monitoring circuit part when the frequency is reduced.

The principle of the circuit arrangement illustrated in FIG. 3 is described in the following text. References to the voltage waveforms which are illustrated schematically in FIGS. 4a–4j additionally show the interaction of the individual circuits. The pulse-width modulator PWM is triggered via the circuit CFFVCO in the VCO, that is to say the frequency of the output signal Up at the output of the circuit arrangement ANSS is dictated by the voltage-controlled oscillator VCO. Variation in the duty ratio is produced by the pulse-width modulator PWM.

If, for example, there is no adjustment requirement via the connections OPTO, IREG on the circuit FCI of the voltage-controlled oscillator VCO, and no adjustment requirement of the connection PG of the circuit CSPG of the pulse-width modulator PWM, then the output signal Up of the circuit arrangement ANSS is at the maximum frequency VCOfmax. This maximum frequency VCOfmax can be set via the control input I/F of the circuit VIC and via the control input CVCO on the circuit arrangement VCOS. The frequency of the voltage-controlled oscillator VCO can likewise be set via the current flow through a resistor R, using said resistor R which is arranged at the connection I/F.

The duty ratio of the output signal Up is influenced in the pulse-width modulator PWM by varying the voltage Ue which is applied to the connection PG via a resistor. The variation of the duty ratio of the PWM is initiated when the capacitor (FIG. 4a, Point 1) which is arranged when the connection CVCO reaches an upper reference voltage VF. A first time variable T1 is determined by a capacitor C1 which is arranged at the connection CVCO. Via triggering of the circuit FFPWM, the voltage-controlled oscillator VCO initiates discharging of the second capacitor C2 (FIG. 4b, Point 4), which is connected to the CPG connection. A second time variable T2 is determined by the discharging of the capacitor C2.

This discharging process, controlled by the circuits PWMS and PWMT, is dimensioned by the selection of the control variable C2 at the connection CPG on the circuit PWMS such that the maximum desired pulse width is preset. On reaching a lower reference voltage VG (FIG. 4b, Point 5), which defines a lower switching point, the pulse-width modulator PWM initiates the pause between pulses in the output signal Up of the drive circuit ANSS. The discharging of the capacitor, which influences the second time variable T2, at the connection CPG is dimensioned such that this takes place faster than the discharge time of the capacitor which influences the first time variable T1, through the voltage-controlled oscillator VCO (FIG. 4a, Points 1, 2 and FIG. 4b, Points 4, 5). The voltage at the connection CPG of the PWM remains at the upper switching threshold VF (FIG. 4b, Points 6, 7) until the VCO, as the result of a trigger pulse originating from the circuit CFFVCO, initiates renewed discharging of the capacitors C1, C2, which determine the first time variable T1 and the second time variable T2, at the inputs CVCO and CPG.

The capacitor C2 can be discharged more quickly, and the second time variable T2 can thus be shortened, that is to say the "On time" of the output signal Up of the drive circuit ANSS is shortened in accordance with the magnitude of the potential applied to PG (FIG. 4b, Points 4, 5; 8, 9; 15, 16). Since the signal of the PWM circuit remains at the upper threshold of the reference voltage VF (FIG. 4b, Points 6, 7; 13, 14), independent setting of the pulse width is implemented by the frequency of the voltage-controlled oscillator VCO, and shortening is in each case possible via the connection PG.

The connections IREG/OPTO allow frequency variation of the output signal of the voltage-controlled oscillator VCO (FIG. 4f). An adjustment requirement via both inputs leads, for example, to a linear reduction in the frequency of the output signal Up, the pulse on time of this frequency being maintained (FIG. 4g).

Since the discharge time of the second time variable (PWM) can only be shortened (by connection PG), a further reduction results in the event of an adjustment requirement via the connections IREG and OPTO for the duty ratio.

The sequence control with variable frequency setting and variable setting of the pulse duration allows adaptation of the power requirement (secondary site) at the output of the converter.

The control of the switch-on pulse for a switching transistor, which is to be controlled, as a function of the input voltage Ue of the converter is carried out via the control input PG. The control process via the connection PG of the circuit CSPG is dimensioned such that protection of the switching transistor is ensured for the very low input voltage. This protection is provided over a wide range for relatively large input voltages for example by shortening the switch-on pulse in inverse proportion to the input voltage. The input voltage of the converter and the pulse duration of the switching transistor behave in an inversely proportional manner, an integral waveform of the input voltage (Ue) of the converter being taken into account (feed forward regulation of the switching transistor) by the capacitor C2 which is arranged at the connection CPG and determines the time variable T2 of the PWM. The voltage waveforms which are shown in FIG. 4c and 4e show the duty ratio of the output signal Up at the maximum frequency (VCO fmax, FIG. 4a). The pulse duration is in each case determined by reaching a "lower" reference voltage VG. The time variable T2 is less than (<) the minimum time variable T1. The time variable T2 is in each case initiated on reaching an "upper" reference voltage VF (FIGS. 4b, 4d, Points 7, 14). The voltage waveforms which are shown in FIGS. 4f to 4j show the duty ratio of the output signal Up at a reduced frequency VCOfx of the voltage-controlled oscillator VCO FIGS. 4h, 4j shows a lower duty ratio for the same adjustment requirement (cf. FIGS. 4b, 4g; 4d, 4i) at the control input PG (PGVmax, PGVmin). The frequency (VCOfmax (FIG. 4a) can be reduced via one of the control inputs IREG or OPTO on the circuit FCI of the VCO (FIG. 4f).

FIG. 5 shows a schematic illustration of the circuit arrangement for driving a converter. An ECL flip-flop ECL-FF2, which is arranged in the circuit FFPWM, is set via a dynamic trigger input on this circuit FFPWM. A signal which is present at the output of the circuit arrangement FFPWM switches the emitter-collector path of the transistor Q28 which is arranged in the difference stage Q28, Q29 of the circuit PWMS; Q25 takes over the current from the current source SQ3. The capacitor C2 is discharged via the current source SQ3, which is arranged at the emitter of the difference stage Q28, Q29 (see FIG. 4, Points 4, 7, 14). The capacitor C2 discharges linearly. The discharging can be varied corresponding to driving of the symmetrical circuit which is arranged on the emitter of the difference stage Q28, Q29, formed from the transistors Q32, Q31. The linearity of the discharging of the capacitor C2 is in this case maintained. A control variable Ue which influences the discharging of the capacitor C2 is in this case connected to a resistor RUe, which is arranged at the anode of the transistor Q32, which is operated as a diode, of the symmetrical circuit. The time for the capacitor to discharge is in this case inversely proportional to the control variable Ue which is applied to the resistor RUe (see FIG. 4, time variable T2 between Points 4–5, 11–12). The discharging of the capacitor C2 is completed when a potential VG, which corresponds to the voltage potential, is reached (PWMT; Q21, Q24). A reset signal, which is passed onto the circuit unit FFPWM, is effected via the difference stage Q21, Q24, which is arranged in the circuit unit PWMT, via the collector of the transistor Q24. The flip-flop ECL-FF2 which is arranged in the circuit arrangement FFPWM produces a potential change in the output signal. A level change in the ECL output signal has the effect of switching off the transistor Q28 in the difference stage Q28, Q29 which is arranged in the circuit unit PWMS. This prevents the capacitor C2 discharging any further. The capacitor C2 is now charged to an "upper" reference voltage VF. During the charging phase of the capacitor C2, only the current source SQ1, which is connected to the base/collector of the transistor Q19 which is connected as a diode, is active. When the potential of the capacitor C2 reaches the potential of the reference voltage VF, then the charging process is ended as a result of the current source SQ2, which is dimensioned to be larger, at the emitter of Q19. The current which has resulted in the charging of the capacitor C2 is dissipated to ground via the emitter of the transistor Q19, which is operated as a diode. The capacitor C2 is now in the waiting position until another trigger pulse, which is passed on, for example, from the voltage-controlled oscillator VCO to the function block PWM via E2, initiates renewed discharging of the capacitor C2.

FIGS. 6, 7, 8 and 9 show a detailed circuit arrangement of the schematic illustration shown in FIG. 3. The method of operation of the circuit arrangement is described as follows:

Voltage/current conversion is carried out at the connection I/F of the switching component VIC, via the transistors Q70, Q71. The buffer circuit formed by the transistors Q65 ... Q71, Q215 ... Q217 and the voltage source VD, which is designed as a band gap, result in the current which is extracted by the transistors Q70, Q71 being independent of temperature, and the frequency in consequence not changing over the temperature range.

The current which flows in the collector of Q71 in the circuit VIC is supplied to the circuit CSPG. The current which flows in the collector of Q70 is supplied to the symmetrical circuit CSVCO Q200 ... Q204. With Q3 ... Q11, Q200 ... Q204 form the current generator for variable frequency operation.

The charge state of CSVC0 is changed via the VCOS which is formed by the transistors Q1, Q2. A differential voltage is present at the bases of the transistors Q1, Q2. Depending on the drive level of the bases, CSVCO is charged via Q200 or is discharged via Q3, Q4, since the discharge current which is generated in Q204 is mirrored in the ratio 2:1 (transistors Q9, Q10, Q3, Q4). The transistors Q8, Q7, Q6, Q5, Q201 are used for desired adaptation of the duty ratio of 56.37%. The waveform of the voltage of the CSVCO is triangular and the duty ratio is completely independent of the magnitude of the current CSVCO, since the current sources have a fixed relationship to one another. The magnitude of the triangular-waveform amplifier which results in the CSVCO is defined by the reference voltages VF and VG which are supplied via the transistors Q124, Q122, Q80 and Q125, Q123, Q81, respectively, to the PWMT and the CFFVCO (comparator/ECL flip-flop frequency). The reference voltages are applied via Q33 and Q35 to the comparator CO, ECL flip-flop/frequency, which, via Q42, compares the voltage on the VCO with these reference voltages. If VCOS reaches the upper or lower value of the reference voltage, reset takes place on the flip-flop Q43, Q44 via Q41 on reaching VF, or set takes place via Q38 on reaching VG. A differential signal of 320 mV, which changes over the switches Q1, Q2 via Q45 ... Q50, results on the flip-flop transistors Q43, Q44 because of the selection of the current in the current sources Q51, Q52, Q53, Q54 and the collector resistances of 3.3K.

The special feature of the circuits described so far results from the design of the input circuit which, via Q36, Q37, Q40, mirrors the current from the voltage source Q9, Q10 into the input stages of the comparator. This results, according to the invention, in the advantage that the input current at the base of Q42 is made dependent on the current in the VCO changeover switch Q1, Q2 and thus, in the event of a frequency variation at the connection VCO in the ratio of 1:100, this base current varies in the same ratio, as a result of which the Darlington stage Q42, Q39, Q41 is matched to the rate of the VCO frequency and the frequency error resulting from the base current in Q42 is kept small.

Since the current sources Q51 ... Q56 operate with the permanently set current, the Darlington input transistors Q33/Q34, Q35/Q38, Q42/Q41, Q42/Q39 allow impedance matching to the VCO current and conversion to constant ECL levels in the collectors Q43, Q44.

The frequency setting is in this case carried out by the following circuit definition: with the mirror ratio of transistors implemented in the circuit example, the maximum frequency of the VCO can be determined by the current set at the connection I/F, the magnitude of the amplitude, VF-VG and the size of the capacitor at the connection VCO. The times t1, t2, the frequency of the VCO and the duty ratio can be determined as follows:

$$t1 = \frac{C_{VCO} \cdot 0.6}{\frac{1.26}{R_{IF} \cdot 2}} \quad [s] \tag{6}$$

$$t2 = \frac{C_{VCO} \cdot 0.6}{\frac{1.26}{R_{IF} \cdot 2} \cdot 0.774} \quad [s] \tag{7}$$

the frequency of the VCO:

$$f_{VCO} = \frac{1}{t1 + t2} = \frac{0.458}{C_{VCO} \cdot R_{IF}} \quad [Hz] \tag{8}$$

the duty ratio:

$$D_R = \frac{t2}{t1+t2} = 56.37\% \quad (9)$$

VF-VG=0.6V Triangular waveform voltage shift
VD=1.26V (Band-gap voltage)
$R_{I/F}$: Resistance at the connection I/F
$f_{VCO}$: Frequency of the voltage-controlled oscillator
$D_R$: Duty ratio The frequency can be set via the connections IREG and OPTO on the circuit FCI, the frequency of the VCO being reduced.

The symmetrical circuit Q208, Q209 mirrors, in the collector of Q208, the current flowing from the connections IREG or OPTO in the symmetrical circuit Q200 ... Q204 such that the currents from the collectors Q208 and Q70 are subtractively superimposed. If the magnitude of the current from the collector Q208 reaches the value of the current from the collector Q70, no current flows in the symmetrical circuit Q200 ... Q204 and the frequency of the connection VCO is zero. This results in the following relationship:

$$t1_{opto/ireg} = \frac{C_{VCO} \cdot 0.6}{\frac{1.26}{R_{IF} \cdot 2} - I_{opto} - I_{opto}} \quad [s] \quad (10)$$

$$t2_{opto/ireg} = \frac{C_{VCO} \cdot 0.6}{\left(\frac{1.26}{R_{IF} \cdot 2} - I_{opto} - I_{opto}\right) \cdot 0.774} \quad [s] \quad (11)$$

$$f_{VCOopto/ireg} = \frac{1}{t1_{opto/ireg} + t2_{opto/ireg}} \quad [Hz] \quad (12)$$

$t1$opto/ireg: discharge time of the capacitor CVCO at the connection VCO during adjustment of the connections OPTO or IREG.

$t2$opto/ireg: charging time of the capacitor CVCO at the connection VCO during adjustment at the connections OPTO or IREG fVCO opto/ireg: frequency of the VCO when the connections OPTO OR IREG are active This type of frequency setting results in a wide range of frequency variation. The relationship relating to this is illustrated graphically in FIG. 4 and FIGS. 10 to 13. A frequency variation of more than 1:700 can be implemented on an integrated exemplary embodiment.

The inputs OPTO and IREG are joined together at the collector Q209 (FCI) and have the effect of an OR circuit on the frequency setting. Thus, for example OPTO can carry out a control function of the secondary side of the transformer via an optocoupler and IREG can allow control of the maximum current of the power transistor on the primary side.

In the circuit arrangement illustrated in FIGS. 6, 7, 8 and 9, pulse-width modulation is carried out as explained in the following text: the capacitor which is arranged at the connection CPG is controlled via the PWMS Q28, Q29. If the capacitors CVCO and CPG are the same size and no adjustment is made of the connections OPTO and IREG, the adjustment of the current source Q206, Q15/Q16, Q30, Q75 with respect to the current sources Q200, Q3/4 results in the capacitor at the connection VCO discharging slightly faster (without correction by Q17, Q18, Q19) and reaching the lower threshold, which is predetermined by VG. A set is thus carried out at the ECL flip-flop Q43, Q45, via Q35, Q38 .. . Q43, Q44. The differential signal passes via the level shift arrangement Q45 ... Q50 to Q84, Q98 and here carries out a set, via Q98, in the ECL flip-flop Q87, Q88. The circuit refinement of the drive circuit of the ECL flip-flop/PWM (PWM) results in current-saving triggering with low component complexity and short delay times. Only positive flanks at the emitters of Q50, Q48 are able to carry out a set or reset. A set is carried out with Q98, which takes the set current from C2. A reset is carried out with Q85, which takes the reset current from C1. The time constants C1, C2, R (10 kohm) are dimensioned such that a set or reset has reliably decayed in half the duration of the period at the maximum VCO frequency VCOfmax.

After setting of the switches Q28, Q29 has been carried out, a changeover is made in the PWMS via the level shift arrangement Q89 ... Q94. The capacitor C2 at the connection CPG is charged via Q206. The current in the collector Q206 is once again set such that charging is completed earlier than at the capacitor C2 at the connection CVCO. When the potential at the capacitor C2 reaches the voltage level VF, it stays at this voltage level, FIG. 7 and FIG. 8 because of the difference stage Q17/Q18, Q19, the equilibrium of the currents Q206/collector Q19/collector/base, and the configuration of Q19 as a diode. The asymmetric design of the difference stage Q17 ... Q19 in the ratio 2:1 results in desired correction of the voltage level by +18 mV to which the capacitor C2 is charged with respect to VF since, during discharging, the entire current is not immediately taken in the collector of Q15, Q16 from Q17, Q18 (see FIG. 6).

Starting from these initial settings, the adjustment of the pulse width is carried out by RUe at the connection PG. A current I is initially dissipated from the symmetrical circuit Q32, Q31 to GND via the collector Q79. RUe is dimensioned such that current equilibrium exists between the discharge current from the collector Q79 and the current in RUe at the lower input voltage Ue. If the voltage at RUe increases, the symmetrical circuit Q32, Q31 becomes active and, in the discharge phase of the capacitor CPG, contributes to the latter discharging more quickly. Via the difference stage Q20 ... Q27, which is connected by the base of Q25 and the buffer Q125, Q81 to the lower reference voltage VG, a set is carried out at the flip-flop Q87, Q88 when the capacitor CPG discharges to VG via the collector of Q24, as a result of which the difference stage Q28, Q29 is switched over via the level shift Q89 ... Q84, and the charging process starts at the capacitor C2.

If this process is considered on the assumption that the discharging of the capacitor C2 has taken place faster than the discharging of capacitor CVCO, then it can be seen that a set has been carried out on the ECL flip-flop/PWM without there having been any influence from the comparator, ECL flip-flop/frequency VCO.

A set through the flip-flop Q43, Q44 remains ineffective since Q87, Q88 is already set. However, since the capacitor C2 stays at the voltage VF after reaching it and only a reset can be carried out at Q87,Q88 by Q43, Q44, the following relationship is now produced for the ECL signals at MOSL/ MOSH: the frequency is defined by the time variable T1, $R_{I/F}$ and the shift VF-VG. The pulse width can be reduced continuously via the voltage Ue. As a result of the circuit design, the pulse width responds in inverse proportion to the input voltage Ue; doubling of the input voltage results in halving of the pulse width.

The following relationship results with the existing symmetrical relationships of the transistors in the exemplary embodiment:

$$t_{2PG} = \frac{C_{VCO} \cdot 0.6}{\frac{1.26}{R_{IF} \cdot 2} \cdot 0.75 + \left( \frac{U_e}{R_{U_e}} - \frac{1.26}{R_{IF} \cdot 2} \cdot 0.75 \right)} \quad [s] \quad (13)$$

for $$\frac{U_e}{R_{U_e}} > \frac{1.26}{R_{IF} \cdot 2} \cdot 0.75 \quad (14)$$

Starting threshold for on-time shortening $$\frac{U_e}{R_{U_e}} = \frac{1.26}{R_{IF} \cdot 2} \cdot 0.75 \quad (15)$$

Figure 10:
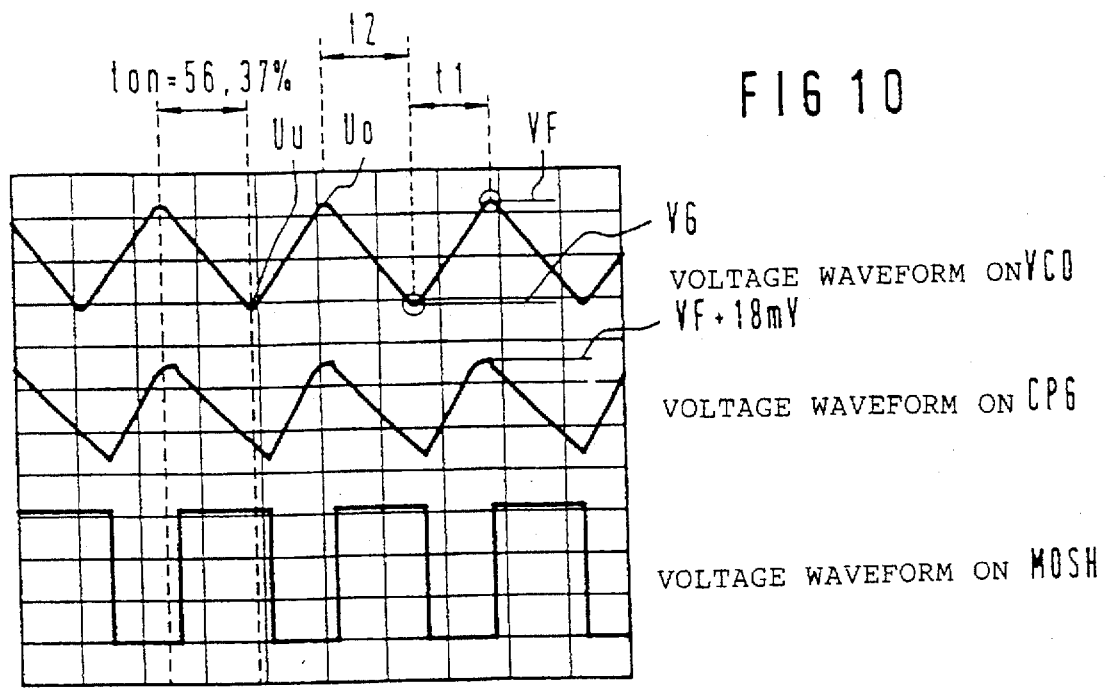
FIG. 10 shows a voltage waveform at the output of the circuit arrangement without pulse shortening.
Figure 11:
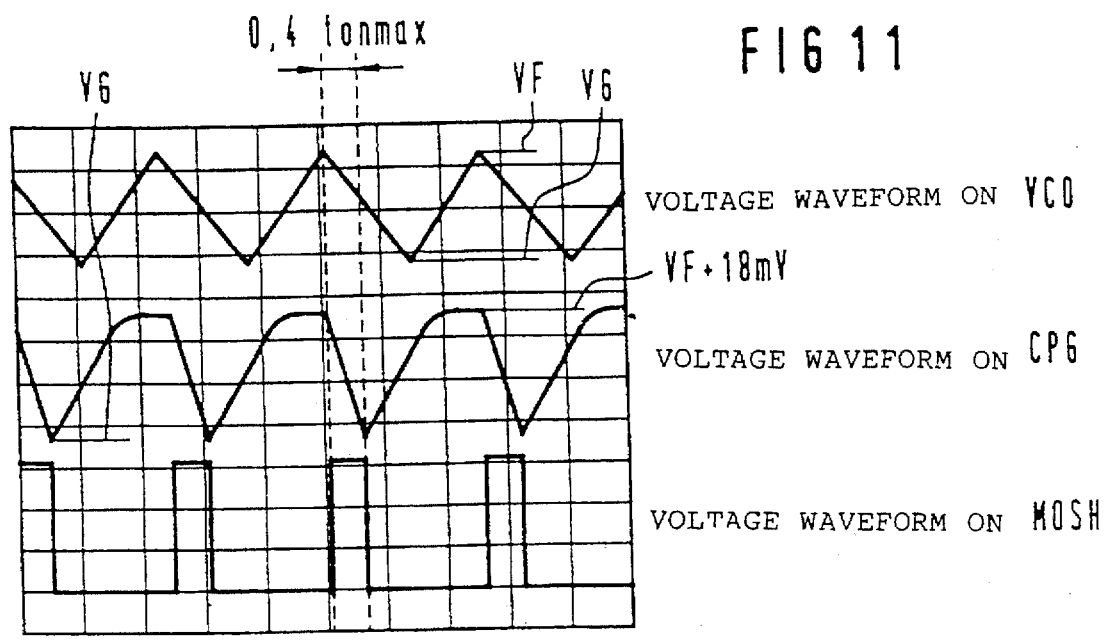
FIG. 11 shows a voltage waveform at the output of the circuit arrangement.
Figure 12:
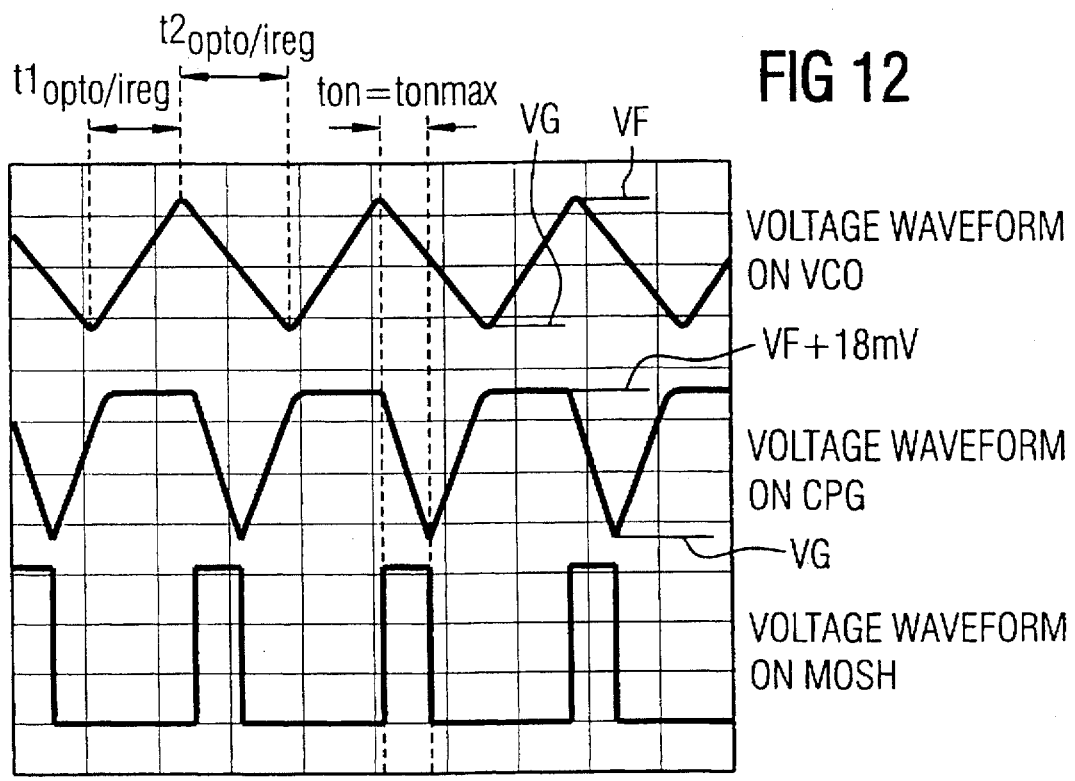
FIG. 12 shows a voltage waveform at the output of the circuit arrangement.

$t_{2PG}$: ON time for pulse-width adjustment
$U_e/R_{U_e}$: Current for on-time shortening The diode forward voltage Q23 is not considered here, but may be subtracted from Ue for more detailed analyses. FIGS. 10, 11 and 12 show voltage waveforms at the connection MOSH as a function of $U_e$.

Since the input voltage Ue acts directly on the capacitor CPG via the current in RUe, the pulse width can be varied without any delay. The connection of RUe to the input voltage and the effect on the pulse width if the threshold voltage Ue is exceeded result in a further condition, which is that, if the frequency on the CSVCO is reduced via IREG or OPTO, the period duration is increased but the pulse duration cannot change since, because of the presetting of the voltage waveforms at VCO and CPG in such a manner that the voltage waveform for the maximum frequency runs less than 1% slower during discharging at CPG than at CVCO, the set pulse for the flip-flop Q87, Q88 takes place immediately, through Q24, in the event of a frequency reduction. The circuit thus makes it possible to adjust the pulse width and frequency independently. The maximum duty ratio is achieved only at the maximum frequency setting and the minimum input voltage Ue.

FIG. 10 shows the voltage waveform at the connection MOSH without pulse shortening via the connection PG.

FIG. 11 shows the voltage waveform at the connection MOSH with pulse shortening of 0.4 $T_{max\ MOSH}$ via the connection PG:

FIG. 12 shows the voltage waveform at MOSH with pulse shortening of 0.8 $T_{max\ MOSH}$ via the connection PG.

Figure 13:
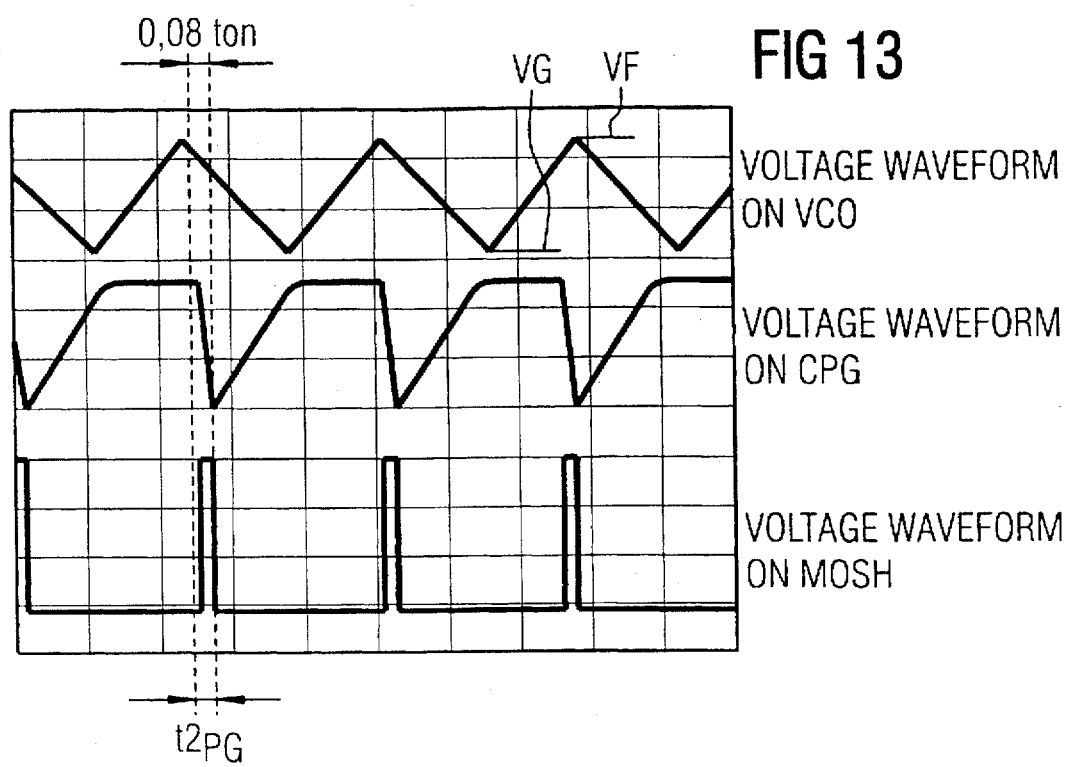
FIG. 13 shows a further voltage waveform of the output of the circuit arrangement.

FIG. 13 shows a voltage wave format MOSH as a result of frequency adjustment with current stabilization at the connections OPTO or IREG. PG is not active.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A circuit arrangement for driving a switch-mode converter or switch-mode power supply, comprising:
    an oscillator which is connected to a pulse-width modulator;
    an electronic switch which is arranged in a main circuit of the converter, the electronic switch being controlled by a switch-on signal whose frequency is variable via at least one control input of the oscillator, and whose duty ratio is variable via at least one control input of the pulse-width modulator;
    the pulse-width modulator having a capacitive storage unit which is connected to a discharge unit, to a charging unit and to a first input of a comparator whose second input is connected to a first reference voltage;
    the charging unit connected to a further comparison unit;
    a control unit having a first input connected to an output of the comparator, and having a second input connected to an output of the oscillator;
    at least one output of the control unit connected to the discharge unit;
    wherein, controlled by the oscillator, discharging of the storage element, originating from a defined potential, is initiated by the control unit while the switch-on signal is emitted from the control unit;
    wherein, on reaching the first reference voltage which is applied to the comparator, the discharging and the switch-on signal are ended by an output signal of the comparator which is passed to the control unit; and
    wherein, subsequently, the storage element is once again charged to the defined potential.

2. The circuit arrangement as claimed in claim 1, wherein the charging unit has a first constant current source connected to the operating potential,
    wherein the comparison unit has a second constant current source and has an emitter, which is connected to its output, of a first transistor whose collector is connected to the operating potential and whose base is at a second reference voltage, and furthermore has a first diode which is connected to the output of the second constant current source and is connected in series with the first constant current source.

3. The circuit arrangement as claimed in claim 1, wherein the discharge unit has a difference stage having two emitter-coupled transistors and a third constant current source, in parallel with which a transistor of a symmetrical circuit is connected, and wherein the anode of a second diode and a resistor are connected to a base of the transistor of the symmetrical circuit, a control variable, which controls the transistor of the symmetrical circuit, being applied to the resistor.

4. The circuit arrangement as claimed in claim 1, wherein the control variable is an input voltage to the circuit arrangement.

5. The circuit arrangement as claimed in claim 1, wherein the discharging of the storage element and of a further storage unit which influences a repetition frequency of the oscillator is initiated by first and second multivibrator stages which are triggered in series, the first multivibrator stage being arranged in the control unit of the pulse-width modulator, and the second multivibrator stage being arranged in the oscillator.

6. The circuit arrangement as claimed in claim 1, wherein a duty ratio of the switch-on signal is settable independently of a maximum repetition frequency of the oscillator.

7. The circuit arrangement as claimed in claim 1, wherein the storage units are capacitors.

8. The circuit arrangement as claimed in claim 1, wherein an input impedance of downstream circuits is adapted when the frequency of the voltage-controlled oscillator is reduced.

9. The circuit arrangement as claimed in claim 1, wherein the oscillator is a voltage-controlled oscillator.

10. The circuit arrangement as claimed in claim 1, wherein the transistors operate in an unsaturated mode.

11. The circuit arrangement as claimed in claim 1, wherein temperature-compensating currents are used.

12. The circuit arrangement as claimed in claim 1, wherein the circuit arrangement is integrated on a chip using ECL and current source circuit technology.

* * * * *